United States Patent
Kheirkhahi et al.

(10) Patent No.: US 8,204,451 B1
(45) Date of Patent: Jun. 19, 2012

(54) WIRELESS TRANSCEIVER USING SHARED FILTERS FOR RECEIVE, TRANSMIT AND CALIBRATION MODES

(75) Inventors: Alireza Kheirkhahi, Irvine, CA (US); Hirad Samavati, Santa Clara, CA (US); Srenik Mehta, Union City, CA (US); David Su, Santa Clara, CA (US); Brian Kaczynski, Krakow (PL)

(73) Assignee: QUALCOMM Atheros, Inc., San Jose, CA (US)

( * ) Notice: Subject to any disclaimer, the term of this patent is extended or adjusted under 35 U.S.C. 154(b) by 993 days.

(21) Appl. No.: 12/182,232

(22) Filed: Jul. 30, 2008

Related U.S. Application Data

(60) Provisional application No. 60/973,143, filed on Sep. 17, 2007.

(51) Int. Cl.
*H04B 1/40* (2006.01)
(52) U.S. Cl. ............... 455/84; 455/83; 455/82; 370/280
(58) Field of Classification Search ............ 455/84, 455/83, 82, 213, 306, 307, 339, 67.11, 115.1, 455/226.1; 370/280; 375/232
See application file for complete search history.

(56) References Cited

U.S. PATENT DOCUMENTS

| | | | |
|---|---|---|---|
| 4,571,731 A * | 2/1986 | Klinkovsky et al. ......... 375/223 |
| 4,904,948 A | 2/1990 | Asami | |
| 4,925,302 A * | 5/1990 | Cutler ........................ 356/128 |
| 5,093,634 A | 3/1992 | Khoury | |
| 5,334,891 A | 8/1994 | Marbot | |
| 5,936,430 A | 8/1999 | Patterson | |
| 6,002,273 A | 12/1999 | Humphreys | |
| 6,011,452 A | 1/2000 | Loukkola | |
| 6,285,225 B1 | 9/2001 | Chu et al. | |
| 6,326,859 B1 | 12/2001 | Goldman et al. | |
| 6,404,240 B1 | 6/2002 | Hakkal et al. | |
| 6,404,289 B1 | 6/2002 | Su et al. | |
| 6,496,075 B2 | 12/2002 | Justice et al. | |
| 6,556,093 B2 | 4/2003 | Craninckx et al. | |
| 6,570,453 B2 | 5/2003 | Su et al. | |
| 6,683,478 B2 | 1/2004 | Yoo | |
| 6,731,176 B2 | 5/2004 | Su et al. | |
| 6,731,627 B1 * | 5/2004 | Gupta et al. ................ 370/352 |
| 6,952,594 B2 * | 10/2005 | Hendin ..................... 455/552.1 |

(Continued)

OTHER PUBLICATIONS

U.S. Appl. No. 12/204,310, entitled "Variable Transconductance Mixer System", by Hirad Samavati, filed Sep. 4, 2008.

(Continued)

*Primary Examiner* — Minh D Dao
(74) *Attorney, Agent, or Firm* — Bay Area Technology Law Group PC

(57) ABSTRACT

A transceiver for use in a wireless device. The transceiver may include a receive portion for receiving an input RF signal. The receive portion may include at least one receive filter which may include a first filter. The transceiver may also include a transmit portion for transmitting an output RF signal. The transmit portion may include at least one transmit filter, which may include the first filter used in the receive portion. The transceiver may further include a plurality of switches, which may include a first switch coupled to an input of the first filter and a second switch coupled to an output of the first filter. The plurality of switches may be configurable to enable use of the first filter in the receive portion for receiving the input RF signal and use of the first filter in the transmit portion for transmitting the output RF signal.

16 Claims, 12 Drawing Sheets

U.S. PATENT DOCUMENTS

| | | | |
|---|---|---|---|
| 6,982,993 B1* | 1/2006 | Claveloux et al. | 370/503 |
| 7,007,296 B2* | 2/2006 | Rakib | 725/111 |
| 7,027,773 B1 | 4/2006 | McMillin | |
| 7,075,383 B2 | 7/2006 | Adachi et al. | |
| 7,116,952 B2 | 10/2006 | Arafa | |
| 7,375,557 B2 | 5/2008 | Cho | |
| 7,398,071 B2* | 7/2008 | Jensen | 455/260 |
| 7,447,284 B2 | 11/2008 | Raj et al. | |
| 2004/0102172 A1* | 5/2004 | Hendin | 455/302 |
| 2006/0111138 A1* | 5/2006 | Satou | 455/550.1 |
| 2006/0135105 A1* | 6/2006 | Jensen | 455/260 |
| 2006/0145771 A1 | 7/2006 | Strange | |
| 2006/0238265 A1 | 10/2006 | Soltanian et al. | |
| 2007/0075774 A1 | 4/2007 | Yoshizawa et al. | |
| 2008/0232279 A1* | 9/2008 | Marholev | 370/280 |
| 2008/0297250 A1 | 12/2008 | Yee | |
| 2008/0305759 A1 | 12/2008 | Tervaluoto et al. | |
| 2010/0091752 A1* | 4/2010 | Kemmochi et al. | 370/339 |
| 2011/0267127 A1* | 11/2011 | Staszewski et al. | 327/306 |

OTHER PUBLICATIONS

"U.S. Appl. No. 12/120,827 Office Action", Oct. 9, 2009, 10 pages.

* cited by examiner

WIRELESS TRANSCEIVER USING SHARED FILTERS FOR RECEIVE, TRANSMIT AND CALIBRATION MODES

PRIORITY CLAIM

This application claims priority to provisional application Ser. No. 60/973,143 titled "A Dual-Band CMOS MIMO Radio SoC for IEEE 802.11n Wireless LAN", filed on Sep. 17, 2007, whose inventor is Manolis Terrovitis, which is hereby incorporated by reference in its entirety as though fully and completely set forth herein.

FIELD OF THE INVENTION

The present invention relates generally to a transceiver, such as used in a wireless LAN transceivers, and more particularly to an RF transceiver which is operable to share filters in two or more modes, such as transmit mode, receive mode, calibration mode, etc.

DESCRIPTION OF THE RELATED ART

Wireless transceivers are being used for a plethora of applications, such as in laptops, cell phones, and other mobile devices. Wireless transceivers are particularly desirable for home wireless networks, e.g., in the wireless router or hub (as well as wirelessly coupled devices) of a user's home. Accordingly, the demand for cheaper, smaller, and more efficient transceivers is increasing rapidly. Thus, it is desirable to increase the efficiency of wireless transceivers, and in particular, decrease the required number of components.

SUMMARY OF THE INVENTION

Various embodiments are presented of a system and method for sharing filters in a wireless transceiver. The wireless transceiver may be included in any of various possible wireless devices, including wireless routers, wireless hubs, laptops, cell phones, mobile devices, and/or other wireless devices.

In one embodiment, the transceiver may include a receive portion for receiving an input RF signal. The receive portion may include at least one receive filter, which may include a first filter. The receive portion may further include an input stage for receiving an input RF signal, a receive mixer stage for mixing the RF signal with a mixing signal, and/or an analog to digital converter (ADC) coupled to an output of the at least one receive filter, among other possible components.

The transceiver may further include a transmit portion for transmitting an output RF signal. The transmit portion may include at least one transmit filter, which may include the first filter used in the receive portion. Thus, the first filter may be shared between the transmit and receive portions. The transmit portion may further include a digital to analog converter (DAC), a transmit mixer stage coupled to an output of the at least one transmit filter for mixing the output of the at least one transmit filter with a mixing signal, and/or a power amplifier coupled to an output of the transmit mixer stage for generating an output RF signal.

The transceiver may include a plurality of switches, which may include at least one first switch coupled to an input of the first filter and a second switch coupled to an output of the first filter. The plurality of switches may be configurable to enable use of the first filter in the receive portion for receiving the input RF signal and use of the first filter in the transmit portion for transmitting the output RF signal. Thus, the transceiver may be configurable to switch use of the first filter between the transmit and receive portions of the transceiver, e.g., using the plurality of switches.

The plurality of switches may be further configurable to enable use of the first filter in a calibration mode for calibrating the at least one receive filter and/or the at least one transmit filter. In one embodiment, the at least one receive filter may include the first filter and a second filter. Accordingly, the plurality of switches may be further configurable to enable use of the first filter and the second filter in a calibration mode for calibrating the at least one receive filter and/or the at least one transmit filter.

Additionally, the switches may be further configurable to enable use of the first filter in a carrier leak calibration mode, wherein, in the carrier leak calibration mode, the switches are configurable to form a path comprising portions of each of the receive portion and the transmit portion. In one embodiment, the plurality of switches may include a third switch which is configurable, in the leak configuration mode, to bypass the first filter of the at least one transmit filter.

Accordingly, a method for operating a transceiver in a wireless device may include configuring the transceiver to transmit output RF signals, which may include configuring the plurality of switches to form a transmission pathway for transmitting the output RF signals. As indicated above, the transmission pathway may include at least one transmit filter including a first filter. Output RF signals may then be transmitted using the transmission pathway.

The method may further include configuring the transceiver to receive input RF signals, which may include configuring the plurality of switches to form a receive pathway for receiving the input RF signals. As indicated above, the receive pathway may include at least one receive filter which may include the first filter used in the transmission pathway. Input RF signals may then be received using the receive pathway.

Similar to above, the transceiver may also be configured to perform a first calibration. Configuring the transceiver to perform the first calibration may include configuring the plurality of switches to form a first calibration pathway to perform the first calibration. The first calibration pathway may include the at least one transmit filter and the at least one receive filter. Accordingly, the first calibration may be performed using the first calibration pathway. The first calibration may calibrate the first filter (among other possible filters, such as the receive and/or transmit filter).

Additionally, the transceiver may be configured to perform a carrier leak calibration, e.g., by configuring the plurality of switches to form a carrier leak calibration pathway to perform the carrier leak calibration. Similar to above, the carrier leak calibration pathway may include the at least one transmit filter and the at least one receive filter. Accordingly, the carrier leak calibration may be performed using the carrier leak calibration pathway.

The plurality of switches may include a first and second switch coupled to the input of the first filter, and a third switch coupled to the output of the first filter. Additionally, or alternatively, the plurality of switches may include a fourth switch configurable to bypass the first filter. Accordingly, the method may include enabling the fourth switch to perform a carrier leak calibration of the transceiver, e.g., using a carrier leak calibration pathway that bypasses the first filter using the fourth switch.

BRIEF DESCRIPTION OF THE DRAWINGS

A better understanding of the present invention can be obtained when the following detailed description of the preferred embodiment is considered in conjunction with the following drawings, in which.

Figure 1:
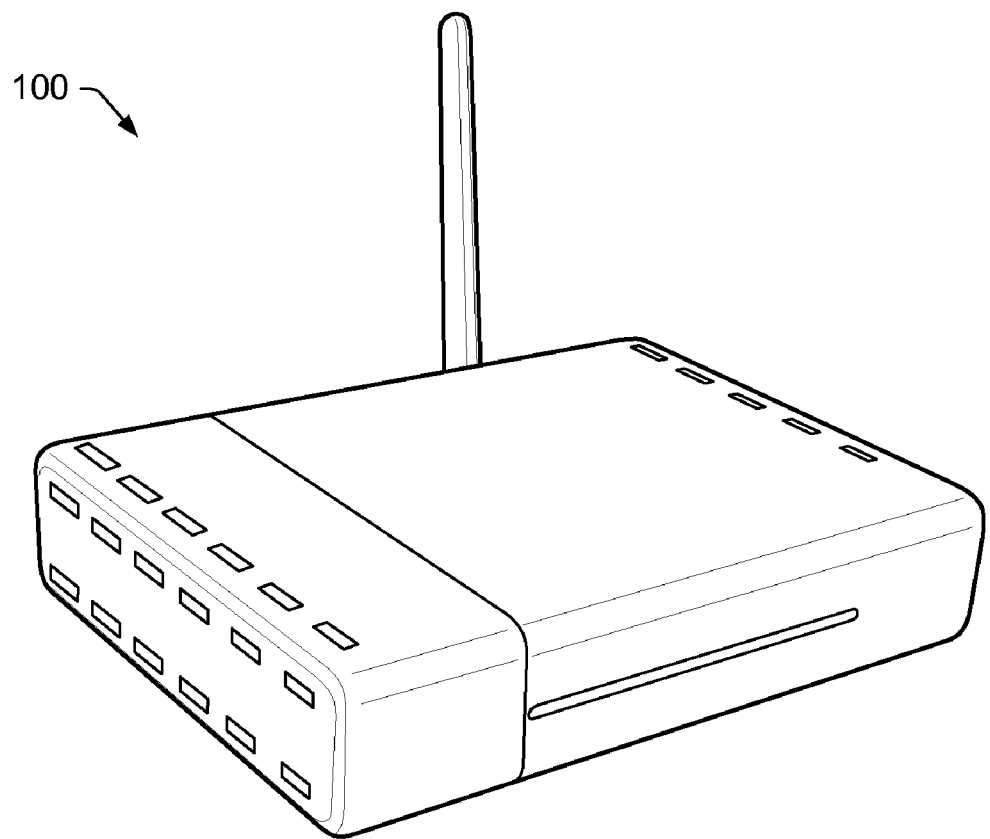
FIG. 1 illustrates an exemplary wireless device, according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

FIG. 1—Exemplary Wireless Device

FIG. 1 illustrates an exemplary wireless device 100, according to one embodiment. The particular wireless device 100 shown in FIG. 1 resembles a wireless hub or router which may be used in various businesses or homes to provide wireless communication for a plurality of other wireless devices. However, it should be noted that other wireless devices are envisioned, such as laptops (or other computer systems), cell phones, personal digital assistants, multimedia players (portable or stationary), or other mobile devices/computing systems which are operable to use wireless communication.

The wireless device may include one or more wireless or wired ports for communicating over a network. The wireless device may further include one or more memory mediums and processors for implementing various functionality. For example, in one embodiment, the wireless device may include program instructions stored on the memory medium which may be executable by the processor to perform the functionality or methods described herein. Additionally, the wireless device 100 may include a wireless transceiver, such as the wireless transceiver described herein. Thus, the wireless device 100 may be operable to perform various methods described herein (e.g., using the wireless transceiver included in the wireless device 100).

Figure 2:
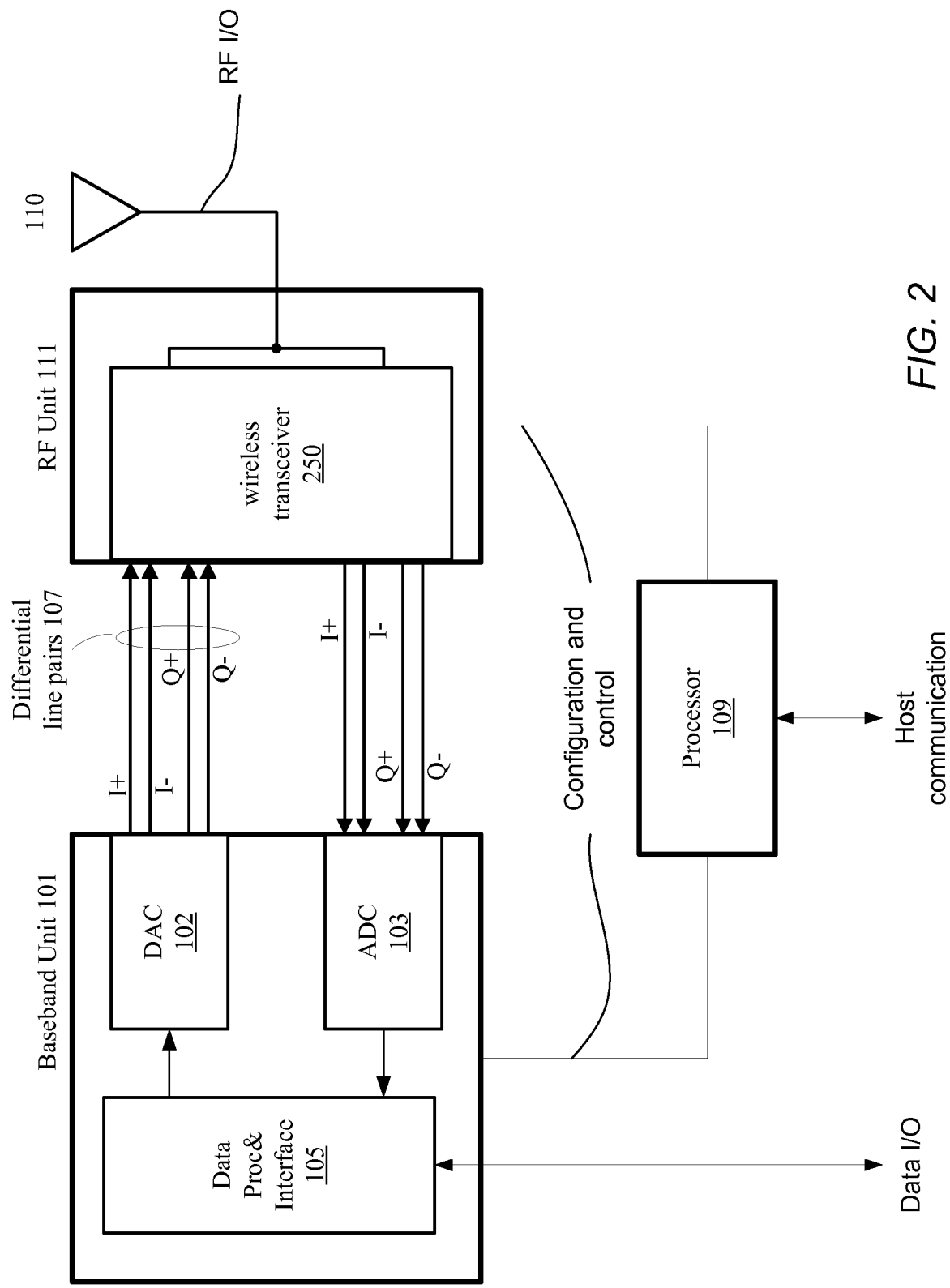
FIG. 2 is a block diagram of the wireless device of FIG. 1, according to one embodiment.

FIG. 2—Exemplary System Diagram of the Wireless Device

As shown, FIG. 2 is an exemplary system diagram of the wireless device 100. As shown, the wireless device 100 may include a wireless transceiver 250 which may be operable to perform the methods described herein. Note that the elements shown in the wireless device 100 in FIG. 2 are exemplary only and that various elements may be added, removed, or connected differently, as desired.

More specifically, the wireless device may include a baseband unit 101 which may transmit and receive data I/O via the data processor and interface 105. Data processor and interface 105 may receive data from ADC 103 and provide data to DAC 102. The DAC 102 (also shown in FIG. 3) may transmit analog information to the wireless transceiver 250 in RF Unit 111 via differential line pairs 107. The wireless transceiver 250 may provide analog data to the ADC 103 in the baseband unit 101. The wireless transceiver may receive and transmit RF signals via RF I/O 110. Both the baseband unit 101 and the RF unit 111 may be coupled to processor 109 which may perform host communication. A memory medium (not shown) may be coupled to the processor 109.

Figure 3:
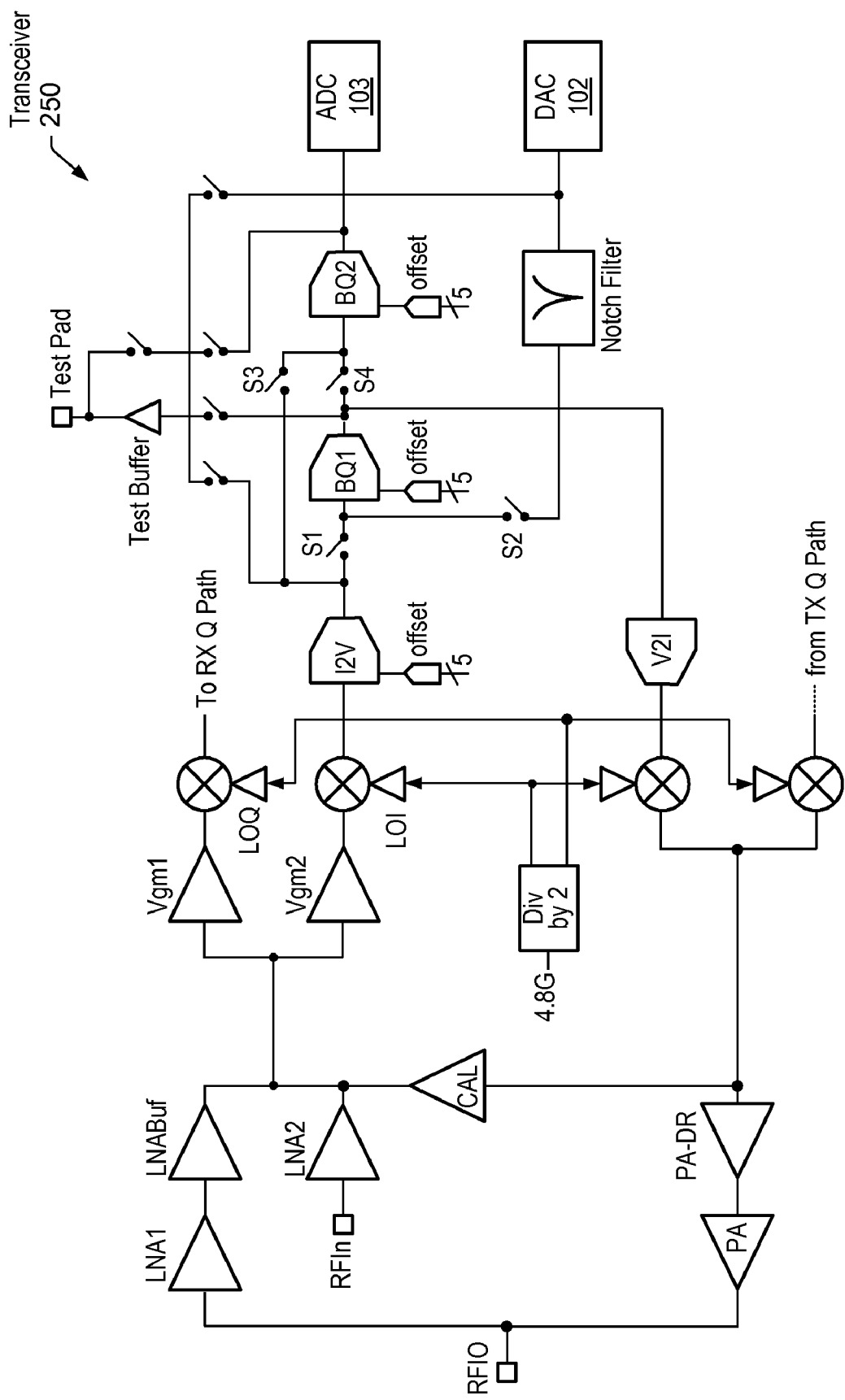
FIG. 3 is a circuit diagram illustrating a wireless LAN transceiver comprised in the wireless device of FIG. 1, according to one embodiment.

FIG. 3—Exemplary Diagram of the Wireless Transceiver

FIG. 3 is an exemplary diagram of the wireless transceiver 250. This particular Figure illustrates a 2 GHz pathway of the wireless transceiver. It should be noted that 5 GHz pathways (or transceivers configured for either pathway) are envisioned. An exemplary 5 GHz pathway is provided below. In the following section, the receive pathway will be described followed by the transmit pathway.

As shown, the wireless transceiver may include a radio frequency input output portion (RFIO) which may be coupled to a first low noise amplifier (LNA1) which may be coupled to a low noise amplifier buffer (LNABuf). Note that for the LNA1 path, the receiver input may be shared with the power amplifier (PA), which may eliminate the need for an external transmit/receive (T/R) switch, thereby reducing the overall cost of the final circuit.

In parallel, a radio frequency input (RFIn) may be coupled to a second low noise amplifier (LNA2). Note that the LNABuf may be placed at the output of the LNA1 to augment the gain of LNA1 such that the combination of LNA1 and LNABuf may have more or less the same gain as that of LNA2. However, LNABuf may not be necessary if the output of LNA1 and LNA2 are substantially equal. Note that an external T/R switch may be required for the LNA2 pathway since the LNA2 input may not be shared with the PA output. Thus, the LNA2 pathway may be used in application where the best receiver sensitivity is the primary objective, whereas the LNA1 path may be better suited for cost sensitive applications.

The LNA2 may be coupled to Vgm1 (variable gain transductance cells) which may be provided to a LOQ mixer. The LOQ mixer may receive input from a 4.8 GHz clock after divided by 2 by the Div by 2 block shown. The LOQ mixer may provide output to an RX Q Path. The output of the LNA2 may also be coupled to Vgm2 which may provide its output to LOI mixer (which receives clock from the 4.8 GHz clock after divided by 2, as described above). In the descriptions above, it should be noted that variable gain amplifiers (VGAs) may be coupled to the output of the LNAs, e.g., before the mixers. Additionally, the mixers described above may be direct conversion mixers.

The mixers may downconvert the signal to baseband in-phase (I) and quadrature-phase (Q) signals. The I and Q signals may be low-pass filtered and amplified by the baseband programmable gain filter (which may be controlled by digital logic). The baseband I and Q signals may be sent to the analog to digital converter (ADC) 103 (which may represent a plurality of ADCs, e.g., 2 ADCs) shown via various filters. The DC offset of the receive pathway may be reduced using multiple digital to analog converters (DACs) controlled by a MAC/baseband block. Additionally, the receive pathway may be digitally powered down to conserve power.

Turning to the specific elements of FIG. 3, the downconverted output of the LOI mixer may be provided to the I2V (current to voltage converter) block which may convert current to voltage and acts as a first order filter. In some embodiments, the bandwidth of the I2V may be different for different modes of operation. For example, if the wireless transceiver 250 is used in a standard channel configuration, then the bandwidth of the I2V may be 10.2 MHz. On the other hand, when the wireless transceiver 250 is configured for an extended channel, the bandwidth of the I2V may be set to 20.4 MHz.

Output of the I2V may then be provided through two biquad filters, BQ1 and BQ2 (via S1 and S4). The three filtering stages, namely I2V, BQ1, and BQ2 may together form a fifth order Butterworth filter. In one embodiment, the I2V may include a filter with a first order Butterworth response, and the BQ1 and BQ2 may each include filters with a second order Butterworth response. The bandwidth of the fifth order filter may either be set to 10.2 MHz or 20.4 MHz similar to descriptions above. As also shown, the BQ1 and BQ2 filters may be controlled or bypassed using switches S1, S2, S3, and S4, which are described in more detail below.

On the transmit pathway, the output of the DAC 102 (which may represent a plurality of DACs, e.g., 2 DACs) may be coupled to a notch filter which may be in turn connected to BQ1 via S2 and S4. The DAC 102 may be clocked at 176 MHz/160 MHz, as desired. The notch filter may be tuned, e.g., to 160 MHz, and may follow the DAC 102 to attenuate the DAC image. Additionally, the notch filter may be programmable using a digital control word. Since the transmission pathway uses BQ1 (e.g., and not BQ2), the overall transfer function may be a second order Butterworth filter. In other words, even though BQ1 is shared between receive and transmit pathways, Q of the filter may be set differently for receive and transfer modes because of the different order Butterworth filters resulting from the pathways. Note that use of a notch filter and a second order Butterworth filter may provide superior noise performance compared to a third order filter. The output of BQ1 may be provided to filter V2I, which may be a voltage to current converter.

This output, in conjunction with the 4.8 GHz clock after being divided by 2 may be provided to mixers (e.g., direct conversion mixers) which may be I/Q up converter mixers. This output may be provided to a power amplifier driver (PA-DR) which may be provided to the power amplifier (PA). The output of the PA may be provided to the RFIO for output.

Note that the transmit pathway can be digitally powered down to conserve power. In some embodiments, to ensure that FCC limits are observed and output power stays close to the maximum allowed, transmit output power may be adjusted by a closed loop digitally programmable control, e.g., at the start of each packet. The closed-loop power control can be based on an on-chip or off-chip power detector, as desired.

Finally, a calibrate block may connect the transmit and receive pathways for calibration modes described below and a test buffer and test pad output may be coupled to the outputs of various ones of the filters described above for testing purposes.

Figure 4:
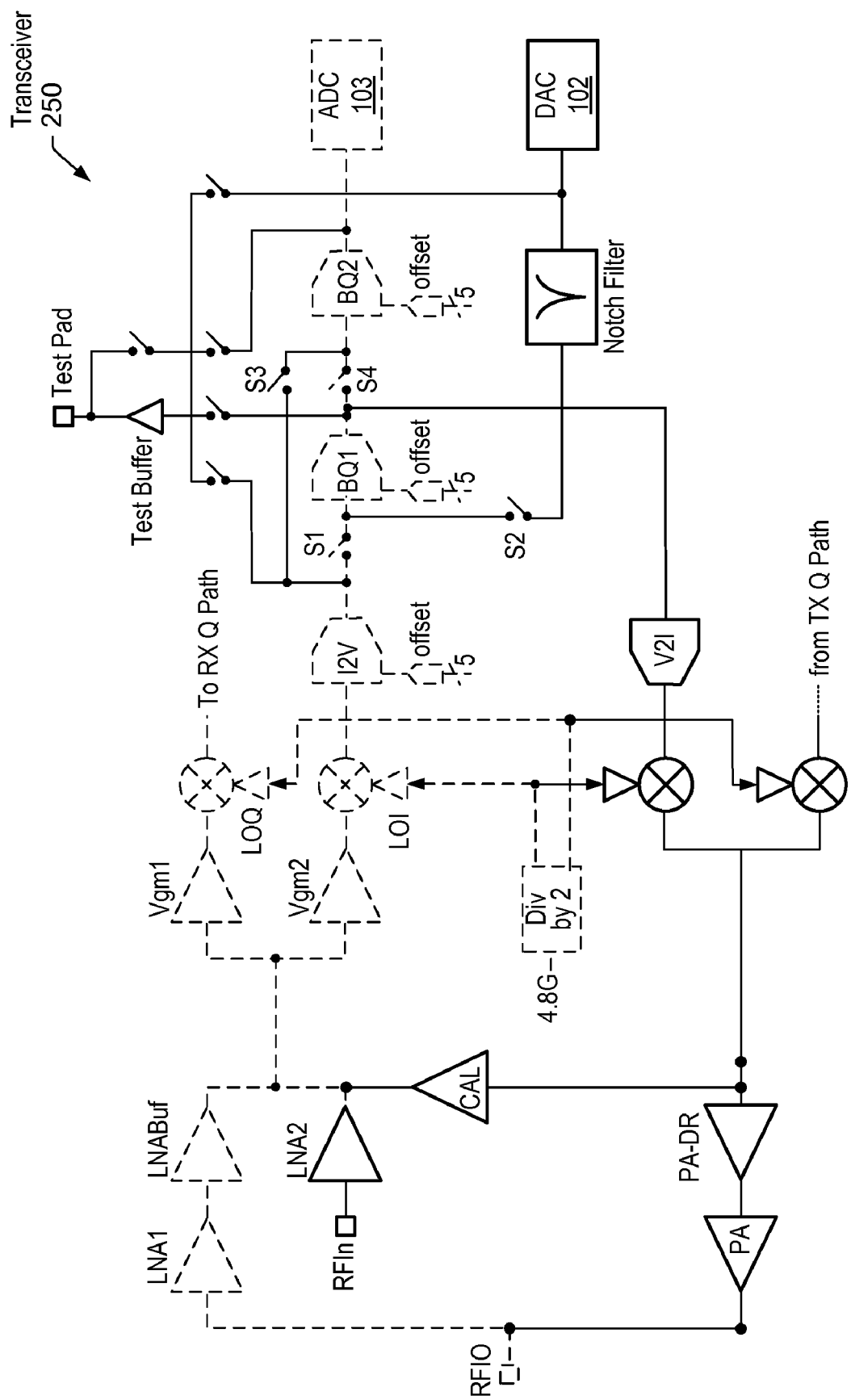
FIG. 4 illustrates a receive path of the wireless LAN transceiver circuit of FIG. 3, according to one embodiment.

FIG. 4—Receive Pathway of the Transceiver

FIG. 4 illustrates an exemplary receive pathway of the transceiver 250 illustrated in FIG. 3 (as dashed lines). In this pathway, the LNA1 and LNABuf is used rather than the LNA2 pathway. However, as indicated above, the LNA2 pathway is also envisioned, e.g., for cases demanding higher receiver sensitivity.

As shown, RF input may be received at RFIO. The pathway may then flow through LNA1, LNABuf, Vgm1 to LOQ mixer and Vgm2 through LOI mixer (both of which receive output from the 4.8 GHz clock divided by two (to achieve 2.4 GHz). The pathway from LOI mixer passes through the I2V, S1 (activated), BQ1, S4 (activated), BQ2, and finally to the ADC 103. Switches S2 and S3 may be deactivated during reception.

Figure 5:
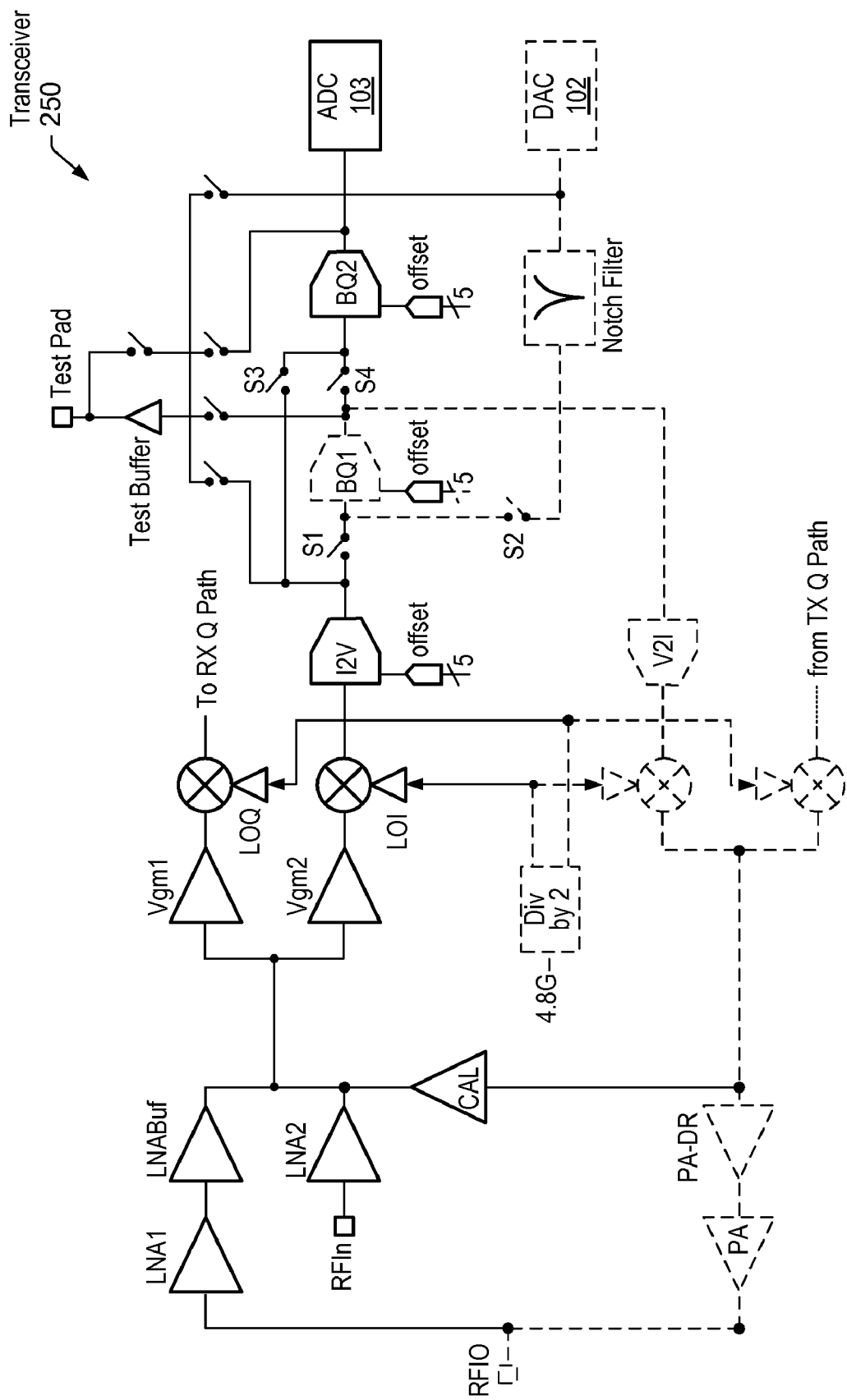
FIG. 5 illustrates a transmit path of the wireless LAN transceiver circuit of FIG. 3, according to one embodiment.

FIG. 5—Transmit Pathway of the Transceiver

FIG. 5 illustrates an exemplary transmit pathway of the transceiver 250 illustrated in FIG. 3 (as dashed lines).

As shown, the pathway may flow through the DAC 102, the notch filter, S2 (activated), BQ1, V2I (voltage to current converter), and the mixers (also receiving input clock input from 4.8 GHz/2). The flow may continue from the mixers to the PA-DR, the PA, and the RFIO as RF output. Switches S1, S3, and S4 may be deactivated in this pathway.

Figure 6:
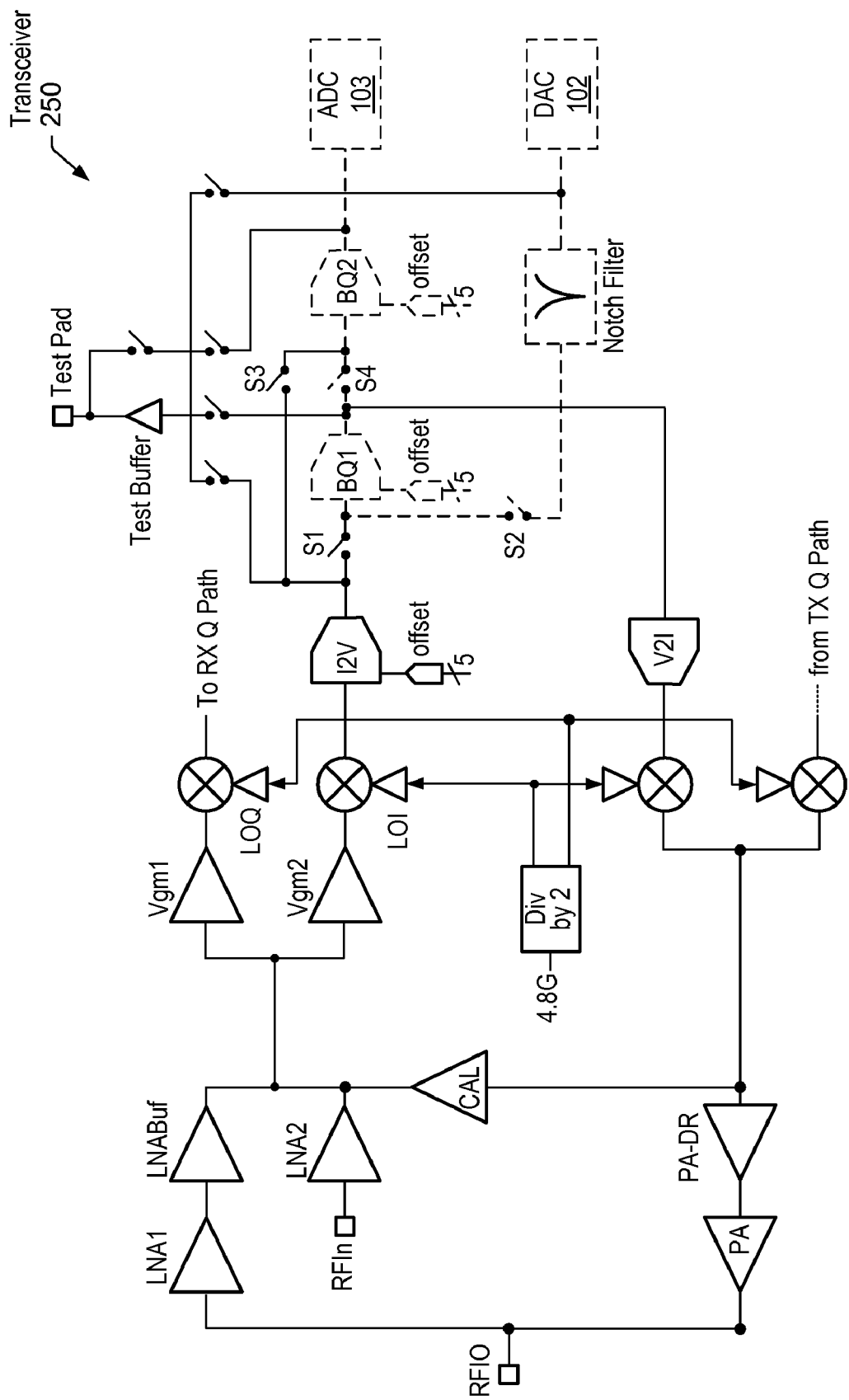
FIG. 6 illustrates a path of the wireless LAN transceiver circuit of FIG. 3 used for filter calibration, according to one embodiment.

FIG. 6—Calibration Pathway of the Transceiver

FIG. 6 illustrates an exemplary calibration pathway of the transceiver 250 illustrated in FIG. 3 (as dashed lines).

A five bit word, "filterfc", (not shown in the transceiver Figures) may control the bandwidth of I2V, BQ1, and BQ2. By changing this five bit word, the bandwidth of the fifth order filter that is composed by I2V, BQ1, and BQ2 may change. Note that only the bandwidth may change and the shape of the filter may always remain an ideal fifth order Butterworth filter. Note that while this five bit word is described herein, other calibrations may be performed for calibrating the bandwidth. For example, different words may be associated with the different filters or other modifications to the pathway may be envisioned. This filtering mode may allow for a feedback path for accurately calibrating the bandwidth of the filter to either 10.2 MHz (e.g., for a standard channel) or 20.4 MHz (e.g., for an extended channel).

In the filter calibration mode of FIG. 6, a test signal may be injected to the notch filter input (from the DAC) and passed through BQ1 and BQ2 (via switches S2 and S4) and sensed at the receive path output (the ADC 103). The overall transfer function may not be an ideal fifth order Butterworth filter since the I2V is not part of this calibration pathway. Accordingly, the transfer function that is measured is that of a $4^{th}$ order filter that is comprised of the four imaginary poles of the $5^{th}$ order filter. By setting the bandwidth of this $4^{th}$ order filter, the bandwidth of the $5^{th}$ order filter can be adjusted because the pole locations may move in unison among I2V, BQ1, and BQ2. However, it should be noted that in some embodiments, the pathway may be modified to include the I2V, and that other calibration pathways are envisioned in general.

Figure 7A:
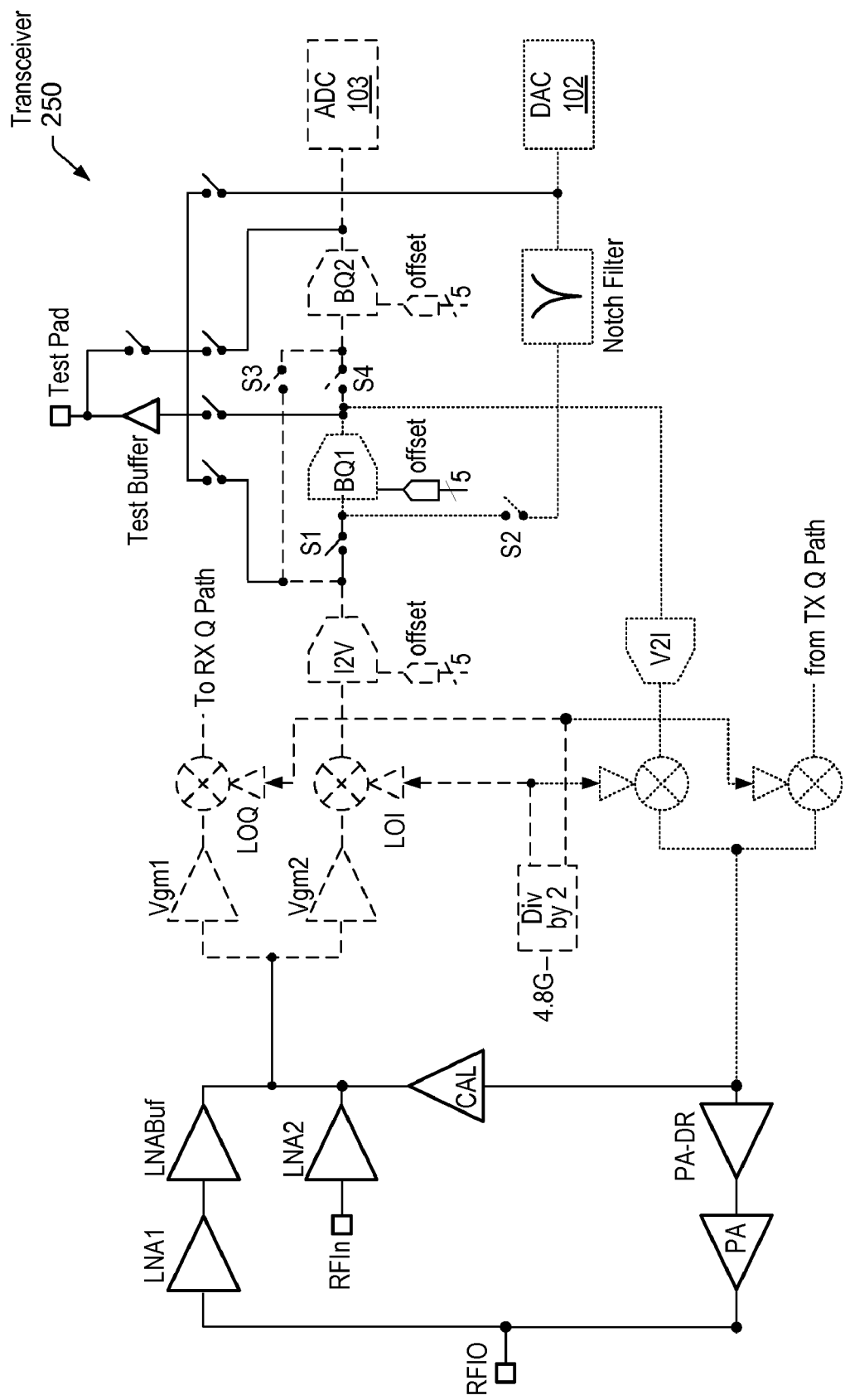
FIGS. 7A and 7B illustrates a path of the wireless LAN transceiver circuit of FIG. 3 used for carrier leak calibration, according to one embodiment.
Figure 7B:
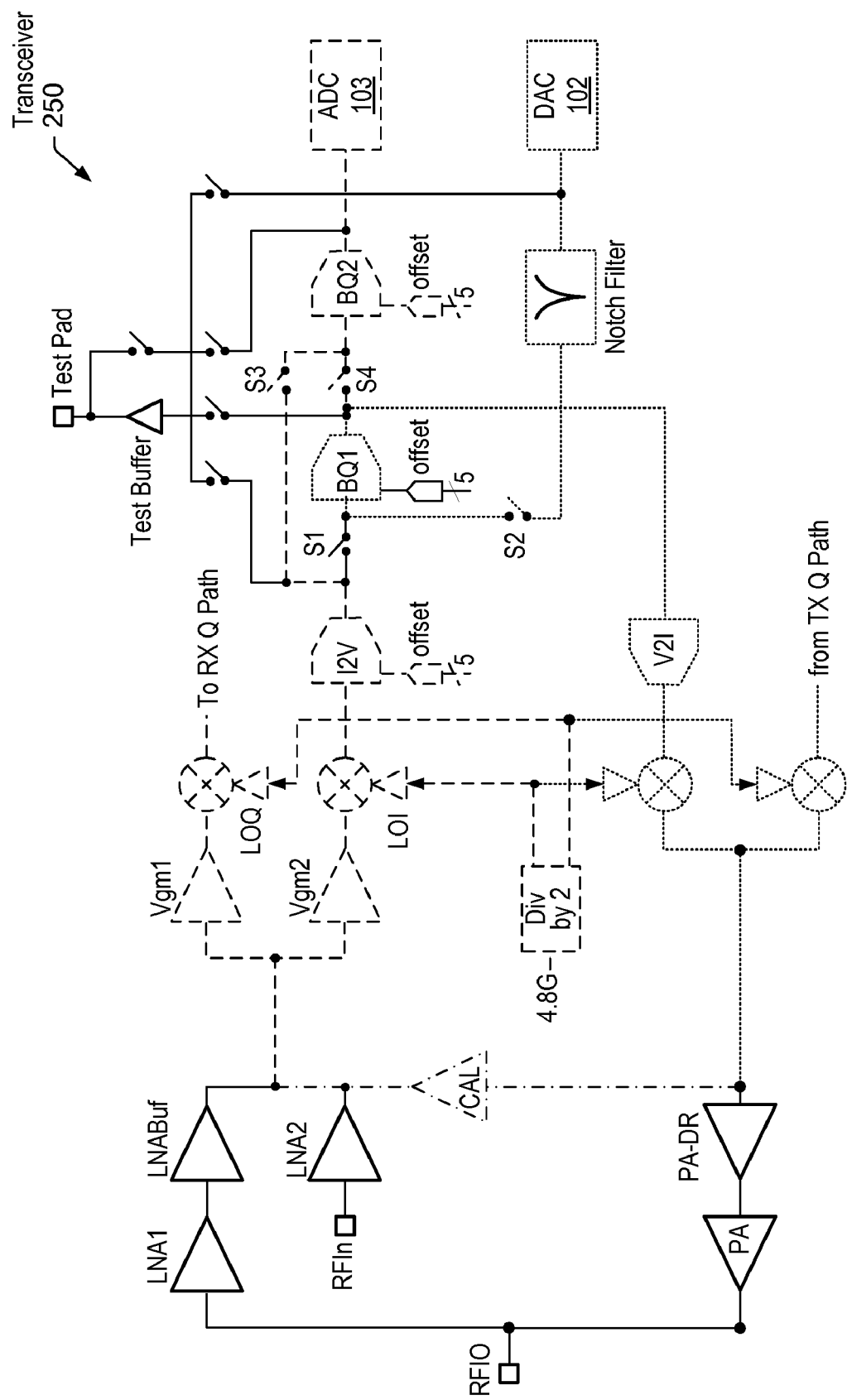

FIGS. 7A and 7B—Carrier Leak Calibration Pathway of the Transceiver

FIGS. 7A and 7B illustrate an exemplary carrier leak calibration pathway of the transceiver 250 illustrated in FIG. 3 (as dashed lines and dotted lines).

In FIG. 7A, both the receive and transmit pathways are on (represented by dashed lines and dotted lines respectively), but the loop back in the RF is not active. More specifically, the receive pathway described above is present from Vgm1 and Vgm2 through the ADC 103 (except skipping BQ1 via the activation of S3 and the deactivation of S1 and S4. The transmit pathway is active from the DAC 102 through the output of the transmit mixers. In one embodiment, this mode may not have a $5^{th}$ order receive pathway filter because BQ1 may be configured to be part of the transmit pathway and the receive pathway does not include the BQ1 filter. This particular pathway may be invoked in order to store the offset of the receive pathway before entering "carrier leak loop back mode".

In FIG. 7B, the calibration pathway connecting the transmit and receive pathways is active, as shown. In this mode, as indicated above, the calibration feedback block that feeds the output of the transmission mixers to the input of the Vgms is turned on and the transmission leak is downconverted and is sensed at the receive pathway output (ADC 103). By adjusting the offset of the transmit DAC, the transmit leak may be removed.

Figure 8:
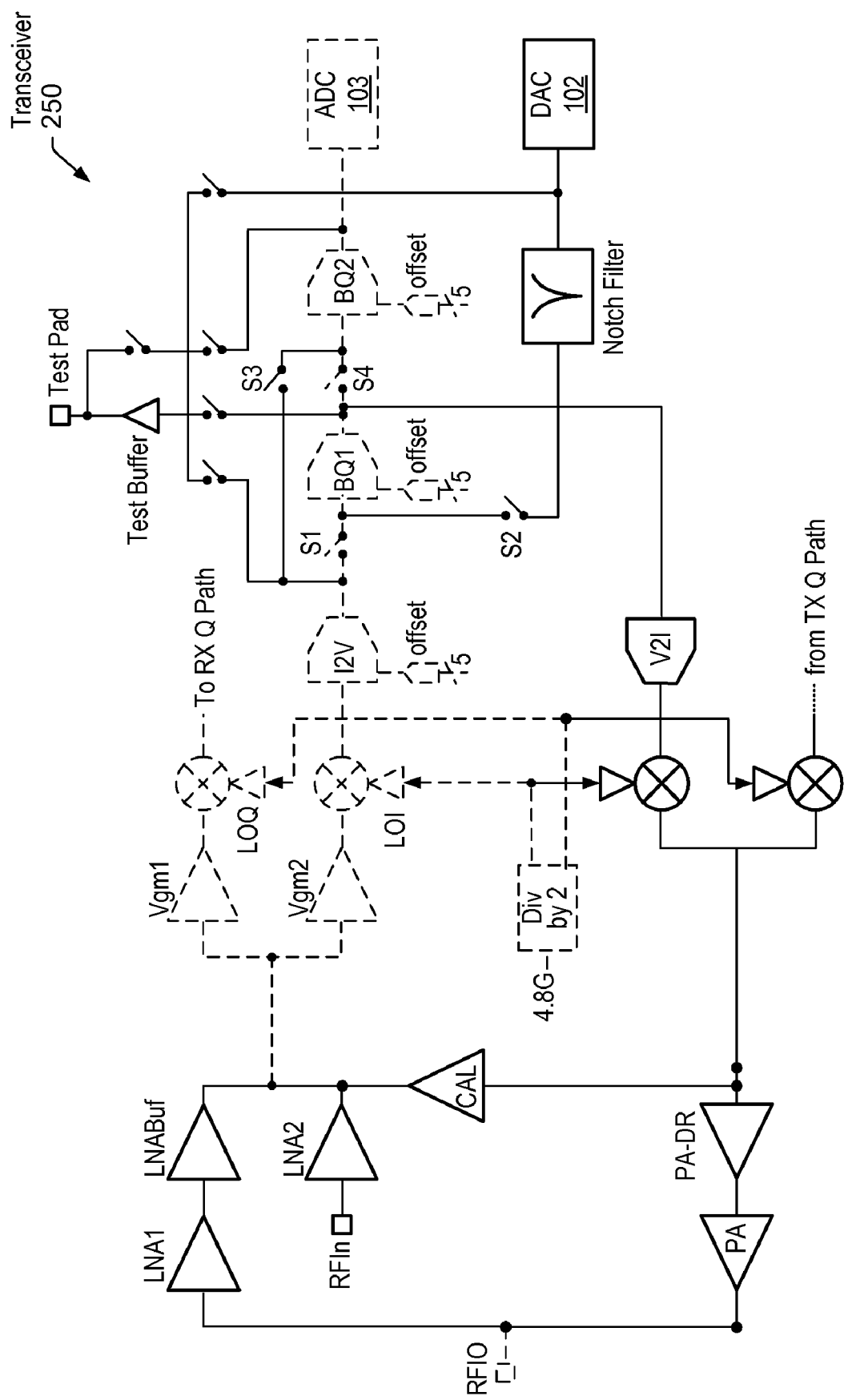
FIG. 8 illustrates an exemplary calibration pathway of the wireless LAN transceiver circuit of FIG. 3, according to one embodiment.

FIG. 8—Exemplary Calibration Pathway of the Transceiver

FIG. 8 illustrates an exemplary calibration pathway of the transceiver 250 illustrated in FIG. 3 (as dashed lines).

More specifically, this calibration mode may be used for DC offset cancellation. For this mode, the receive pathway of FIG. 4 may be activated, but the LNAs may be deactivated to make sure that no strong signal or blocker can get into the system during DC offset cancellation. Once in this mode various DACs may be adjusted sequentially until the DC offset is removed.

Figure 9:
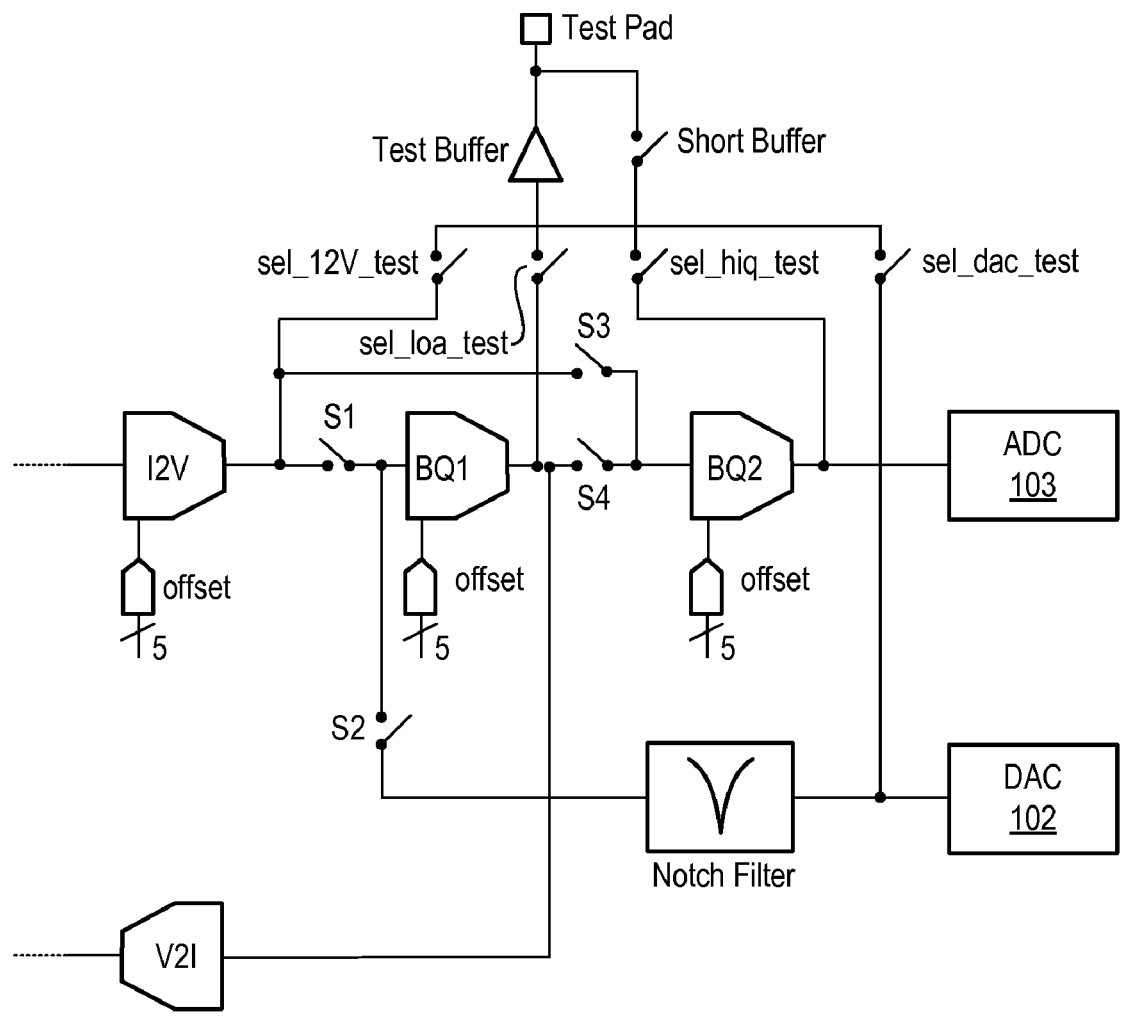
FIG. 9 illustrates an exemplary portion of the transceiver circuit of FIG. 3 for describing various baseband test pathways, according to one embodiment.

FIG. 9—Exemplary Baseband Test Pathways of the Transceiver

FIG. 9 illustrates the filter section of the transceiver 250 for describing various exemplary baseband test pathways of the transceiver 250 illustrated in FIG. 3.

For DAC test mode, the shortbuffer and sel_dac_test switches may be enabled to measure the DAC output voltage. This may be a voltage mode signal.

For ADC 103 test mode, the shortbuffer and sel_hiq_test switches may be enabled and an external signal may be applied to the test pad.

For receive pathway test mode, sel_hiq_test and the test buffer may be enabled and the baseband signals may be correspondingly analyzed. Alternatively, the I2V output or LOQ output may be tested by applying the appropriate switches.

For transmit pathway test mode, sel_dac_test and shortbuffer may be enabled and baseband inputs may be applied externally.

Figure 10:
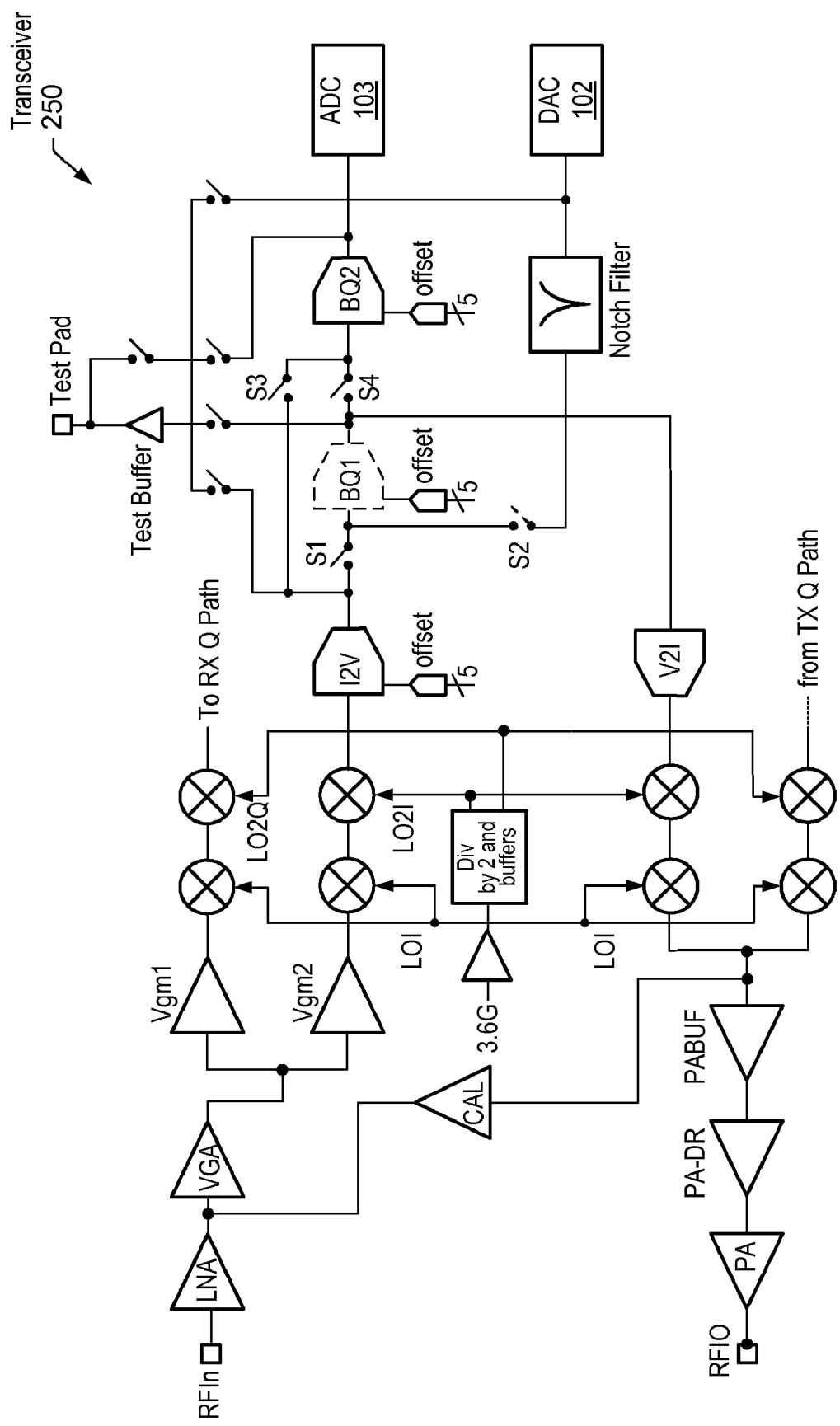
FIG. 10 illustrates an exemplary 5 GHz version of the transceiver circuit of FIG. 3, according to one embodiment.

FIG. 10—5 GHz Transceiver Diagram

FIG. 10 illustrates the transceiver 250 of FIG. 3 except in a 5 GHz form. As shown, the baseband portion may be unaffected, but a different clock (3.6 GHz) and additional mixers may be implemented. Note that the various modes described above may be implemented in a 5 GHz fashion, e.g., using the circuit shown in FIG. 10 with similar switching mechanisms.

Figure 11:
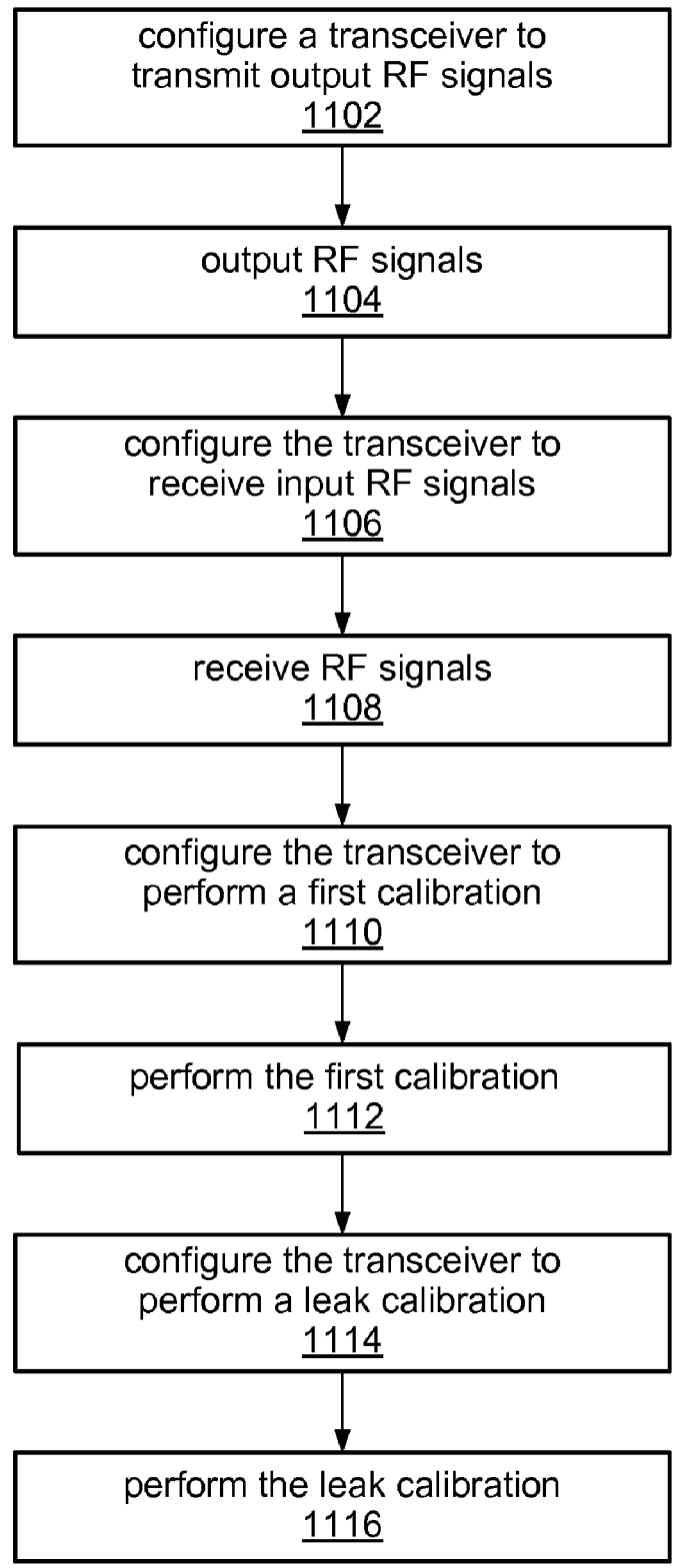
FIG. 11 is a flowchart diagram illustrating one embodiment of a method for using a transceiver that shares one or more filters, according to one embodiment.

FIG. 11—Method for Using a Wireless Transceiver by Sharing a First Filter

FIG. 11 is a block diagram illustrating one embodiment of a method for using a wireless transceiver by sharing a first filter. As indicated above, the wireless transceiver may be included in various wireless devices, such as a wireless router. The method shown in FIG. 11 may be used in conjunction with any of the computer systems, devices, or circuits shown in the above Figures, among other devices. In various embodiments, some of the method elements shown may be performed concurrently, performed in a different order than shown, or omitted. Additional method elements may also be performed as desired. As shown, this method may operate as follows.

In 1102, a transceiver (e.g., the transceiver 250 described above) may be configured to transmit output RF signals. Configuring the transceiver to transmit output RF signals may include configuring a plurality of switches to form a transmit pathway for transmitting the output RF signals. The plurality of switches may include a first and second switch coupled to the input of the first filter (e.g., S1 and S3) and a third switch coupled to the output of the first filter (e.g., S4). The plurality of switches may include a fourth switch configurable to bypass the first filter (e.g., S3). The transmit pathway may include at least one transmit filter (e.g., BQ1, V2I, and the notch filter) which may include a first filter (e.g., BQ1).

In 1104, output RF signals may be output (e.g., to various other wireless devices) using the transmit pathway.

In 1106, the transceiver may be configured to receive input RF signals. Configuring the transceiver may include configuring the plurality of switches to form a receive pathway for receiving the input RF signals. The receive pathway may include at least one receive filter (e.g., the I2V, BQ1, and BQ2), including the first filter (e.g., BQ1) used in the transmit pathway.

In 1108, the input RF signals may be received using the receive pathway.

In 1110, the transceiver may be configured to perform a first calibration. The configuration may include configuring the plurality of switches to form a first calibration pathway to perform the first calibration. The calibration pathway may include the at least one transmit filter and the at least one receive filter. The calibration pathway may specifically include the first filter.

In 1112, the first calibration may be performed using the first calibration pathway. In some embodiments, the first calibration may operate to calibrate the filters of the transceiver (e.g., the first filter of the transceiver).

In 1114, the transceiver may be configured to perform a carrier leak calibration. Similar to above, calibrating the transceiver may include configuring the plurality of switches to form a carrier leak calibration pathway to perform the carrier leak calibration. The carrier leak calibration pathway may include the at least one transmit filter and the at least one receive filter. The carrier leak calibration pathway may specifically include the first filter. The fourth switch may be activated or enabled to perform the carrier leak calibration of the transceiver (e.g., to bypass the first filter in the receive pathway, but still be used in the transmit pathway).

In 1116, the carrier leak calibration may be performed using the carrier leak calibration pathway.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A transceiver, comprising:
a receive portion for receiving an input RF signal, wherein the receive portion comprises at least one receive filter, wherein the at least one receive filter comprises a first filter;
a transmit portion for transmitting an output RF signal, wherein the transmit portion comprises at least one transmit filter, wherein the at least one transmit filter comprises the first filter used in the receive portion;
a plurality of switches, comprising at least one first switch coupled to an input of the first filter and a second switch coupled to an output of the first filter;
wherein the plurality of switches are configurable to enable 1) use of the first filter in the receive portion for receiving the input RF signal; 2) use of the first filter in the transmit portion for transmitting the output RF signal; and 3) use of the first filter in a calibration mode for calibrating the at least one receive filter and/or the at least one transmit filter.

2. The transceiver of claim 1,
wherein the at least one receive filter comprises the first filter and a second filter;
wherein the plurality of switches are further configurable to enable use of the first filter and the second filter in the calibration mode for calibrating the at least one receive filter and/or the at least one transmit filter.

3. The transceiver of claim 1,
wherein the plurality of switches are further configurable to enable 4) use of the first filter in a carrier leak calibration mode, wherein, in the carrier leak calibration mode, the plurality of switches are configurable to form a path comprising portions of each of the receive portion and the transmit portion.

4. The transceiver of claim 3, wherein the plurality of switches comprise a third switch which is configurable, in the leak configuration mode, to bypass the first filter of the at least one transmit filter.

5. The transceiver of claim 1, wherein the transceiver is comprised in a wireless router.

6. A method for operating a transceiver in a wireless device, comprising:
configuring the transceiver to transmit output RF signals, wherein said configuring the transceiver to transmit output RF signals comprises configuring a plurality of switches to form a transmit pathway for transmitting the output RF signals, wherein the transmit pathway comprises at least one transmit filter comprising a first filter;
transmitting the output RF signals using the transmit pathway;
configuring the transceiver to receive input RF signals, wherein said configuring the transceiver to receive input RF signals comprises configuring the plurality of switches to form a receive pathway for receiving the input RF signals, wherein the receive pathway comprises at least one receive filter, wherein the at least one receive filter comprises the first filter used in the transmit pathway; and
receiving the input RF signals using the receive pathway;
configuring the transceiver to perform a first calibration, wherein said configuring the transceiver to perform the first calibration comprises configuring the plurality of switches to form a first calibration pathway to perform the first calibration, wherein the first calibration pathway comprises the at least one transmit filter and the at least one receive filter; and
performing the first calibration using the first calibration pathway.

7. The method of claim 6, wherein said performing the first calibration comprises calibrating the first filter.

8. The method of claim 6, further comprising:
configuring the transceiver to perform a carrier leak calibration, wherein said configuring the transceiver to perform the carrier leak calibration comprises configuring the plurality of switches to form a carrier leak calibration pathway to perform the carrier leak calibration, wherein the carrier leak calibration pathway comprises the at least one transmit filter and the at least one receive filter; and
performing the carrier leak calibration using the carrier leak calibration pathway.

9. The method of claim 6, wherein the plurality of switches comprise:

a first and second switch coupled to the input of the first filter; and
a third switch coupled to the output of the first filter.

10. The method of claim 9, wherein the plurality of switches comprise a fourth switch configurable to bypass the first filter in the receive pathway, and wherein the method further comprises:
enabling the fourth switch to perform a carrier leak calibration of the transceiver.

11. The method of claim 6,
wherein the transmit pathway comprises:
a digital to analog converter (DAC);
the at least one transmit filter coupled to an output of the DAC;
a transmit mixer stage coupled to an output of the at least one transmit filter for mixing the output of the at least one transmit filter with a mixing signal;
a power amplifier coupled to an output of the transmit mixer stage for generating the output RF signals; and
wherein the receive pathway comprises:
an input stage for receiving the input RF signals;
a receive mixer stage for mixing the input RF signals with a mixing signal;
the at least one receive filter coupled to an output of the mixer stage;
an analog to digital converter (ADC) coupled to an output of the at least one receive filter.

12. A transceiver, comprising:
a receive portion comprising:
an input stage for receiving an input RF signal;
a receive mixer stage for mixing the RF signal with a mixing signal;
at least one receive filter coupled to an output of the mixer stage, wherein the at least one filter comprises a first filter;
an analog to digital converter (ADC) coupled to an output of the at least one receive filter;
a transmit portion comprising:
a digital to analog converter (DAC);
at least one transmit filter coupled to an output of the DAC, wherein the at least one transmit filter comprises the first filter used in the receive portion;
a transmit mixer stage coupled to an output of the at least one transmit filter for mixing the output of the at least one transmit filter with a mixing signal;
a power amplifier coupled to an output of the transmit mixer stage for generating an output RF signal;
a plurality of switches, comprising a first switch coupled to an input of the first filter and a second switch coupled to an output of the first filter;
wherein the switches are configurable to enable 1) use of the first filter in the receive portion for receiving the input RF signal; 2) use of the first filter in the transmit portion for transmitting the output RF signal; and 3) use of the first filter in a calibration mode for calibrating the at least one receive filter and/or the at least one transmit filter.

13. The transceiver of claim 12,
wherein the plurality of switches are further configurable to enable 4) use of the first filter in a carrier leak calibration mode, wherein, in the carrier leak calibration mode, the plurality of switches are configurable to form a path comprising portions of each of the receive portion and the transmit portion.

14. The transceiver of claim 13, wherein the plurality of switches comprise a third switch which is configurable, in the leak configuration mode, to bypass the first filter of the at least one transmit filter.

15. The transceiver of claim 12, wherein the transceiver is comprised in a wireless router.

16. A transceiver, comprising:
an input stage for receiving an input RF signal;
a receive mixer stage for mixing the RF signal with a mixing signal;
at least one receive filter coupled to an output of the mixer stage, wherein the at least one filter comprises a first filter;
an analog to digital converter (ADC) coupled to an output of the one or more second filters;
wherein the input stage, the receiver mixer stage, the at least one receive filter, and the ADC compose a receive path of the transceiver;
a digital to analog converter (DAC);
at least one transmit filter coupled to an output of the DAC, wherein the at least one filter comprises the first filter;
a transmit mixer stage coupled to an output of the at least one transmit filter for mixing the output of the at least one transmit filter with a mixing signal;
a power amplifier coupled to an output of the transmit mixer stage;
wherein the DAC, the at least one transmit filter, the transmit mixer stage, and the power amplifier compose a transmit path of the transceiver;
a plurality of switches, comprising a first switch coupled to an input of the first filter and a second switch coupled to an output of the first filter;
wherein the switches are configurable to enable 1) use of the first filter in the receive path for receiving the input RF signal; 2) use of the first filter in the transmit path for transmitting an output RF signal; and 3) use of the first filter in a calibration mode for calibrating the at least one receive filter and/or the at least one transmit filter.

\* \* \* \* \*